United States Patent
Reynolds et al.

(10) Patent No.: US 9,110,506 B2
(45) Date of Patent: Aug. 18, 2015

(54) TACTILE FEEDBACK FOR CAPACITIVE SENSORS

(75) Inventors: Joseph K. Reynolds, Santa Clara, CA (US); Paul J. Ausbeck, Jr., Santa Clara, CA (US); Tracy S. Dattalo, Santa Clara, CA (US)

(73) Assignee: Synaptics Incorporated, San Jose, CA (US)

( * ) Notice: Subject to any disclaimer, the term of this patent is extended or adjusted under 35 U.S.C. 154(b) by 2564 days.

(21) Appl. No.: 11/784,328

(22) Filed: Apr. 5, 2007

(65) Prior Publication Data

US 2008/0246735 A1 Oct. 9, 2008

(51) Int. Cl.
   *G06F 3/041* (2006.01)
   *G06F 3/01* (2006.01)
   *G06F 3/044* (2006.01)
   *H03K 17/96* (2006.01)

(52) U.S. Cl.
   CPC .............. *G06F 3/016* (2013.01); *G06F 3/044* (2013.01); *H03K 17/962* (2013.01); *H03K 2017/9602* (2013.01); *H03K 2217/96062* (2013.01); *H03K 2217/96066* (2013.01); *H03K 2217/960755* (2013.01)

(58) Field of Classification Search
   USPC ............................. 345/156, 174; 341/20–22
   See application file for complete search history.

(56) References Cited

U.S. PATENT DOCUMENTS

| | | | |
|---|---|---|---|
| 5,920,310 A * | 7/1999 | Faggin et al. | 345/173 |
| 6,469,692 B2 | 10/2002 | Rosenberg | |
| 6,473,069 B1 | 10/2002 | Gerpheide | |
| 6,621,029 B2 | 9/2003 | Galmiche et al. | |
| 6,667,697 B2 * | 12/2003 | Botich | 341/22 |
| 7,358,760 B1 * | 4/2008 | Nancekievill et al. | 326/38 |
| 7,653,883 B2 * | 1/2010 | Hotelling et al. | 715/863 |
| 2005/0133347 A1 | 6/2005 | Hein | |
| 2005/0248472 A1 | 11/2005 | Wei | |
| 2006/0214923 A1 * | 9/2006 | Chiu et al. | 345/173 |

FOREIGN PATENT DOCUMENTS

| | | |
|---|---|---|
| GB | 1587408 | 4/1977 |
| KR | 10-2005-0018882 | 2/2005 |
| KR | 10-2007-0005877 | 1/2007 |

OTHER PUBLICATIONS

ISA/US, International Search Report and Written Opinion for International Application No. PCT/US2008058297, 8 pages, Mar. 26, 2008.

* cited by examiner

*Primary Examiner* — Charles V Hicks
*Assistant Examiner* — Jeffrey S Steinberg

(57) ABSTRACT

A tactile feedback apparatus for a capacitive sensing device is comprised of a dielectric insulator having a surface. A finger receiving recess is defined in the surface. The finger receiving recess is configured for receiving a deflected portion of a finger. The finger receiving recess is comprised of a finger deflecting feature and a tactile feedback feature. The finger deflecting feature is coupled to the surface and structured such that a variety of finger sizes pressed into the finger receiving recess would deflect into a predictable and repeatable shape for affecting the capacitive sensing device in a substantially uniform manner. The tactile feedback element is coupled to the surface and disposed such that the tactile feedback element contacts the deflected portion of the finger to provide tactile feedback to the finger only when the finger is sufficiently deflected into the finger receiving recess to actuate the capacitive sensing device.

24 Claims, 14 Drawing Sheets

TACTILE FEEDBACK FOR CAPACITIVE SENSORS

BACKGROUND

Conventional electronic and computing devices enable a user to navigate or input a choice or selection in a number of ways. For example, a user can use an alphanumeric keyboard communicatively connected to the computing device to indicate a choice or selection. Additionally, a user can use a cursor control device communicatively connected to the computing device to indicate a choice. Also, a user can use a microphone communicatively connected to the computing device to audibly indicate a particular selection. Moreover, touch sensing technology can be used to provide an input selection to a computing device or other type of electronic device. In the field of touch sensing technology, there exist several touch sensors which are used for navigation and other input to electronic and computing devices.

One type of touch sensor is the capacitive touch sensor, which senses capacitive changes in response to being touched by a user, such as with a user's finger. A problem that exists with capacitive sensors, and especially those which are non-moving and configured for being actuated by a user's finger, is that they provide little or no feedback to indicate to a user that actuation of the sensor has taken place or that activation may be about to take place. Consider, for example, a capacitive sensor configured as a non-moving "button" input to an electronic device. Because the "button" does not move, a user is provided with no feedback in the form of clicking, movement, or bottoming out to indicate the "button" has been adequately touched to actuate it. Similarly, a hovering palm or inadvertent contact may cause activation without warning or intent. This lack of feedback tends to irritate users, and also causes users to needlessly repress a "button" which has already been successfully actuated, or to press a "button" they do not intend. Some solutions to this problem are to add feedback in the form of a light, a sound (either electrically or mechanically generated), or a movement. However, these solutions add cost and complexity to the capacitive touch sensor and are often impractical for the environments in which capacitive sensors are used. Furthermore, existing solutions may require spacing between "buttons" to be large in order to maintain usability of individual buttons, thus resulting in a lower "button" density than desired.

Thus, a capacitive sensor that addresses one or more of the above-mentioned issues would be advantageous.

SUMMARY

A tactile feedback apparatus for a capacitive sensing device is comprised of a dielectric insulator having a surface. A finger receiving recess is defined in the surface. The finger receiving recess is configured for receiving a deflected portion of a finger. The finger receiving recess is comprised of a finger deflecting feature and a tactile feedback feature. The finger deflecting feature is coupled to the surface and structured such that a variety of finger sizes pressed into the finger receiving recess would deflect into a predictable and repeatable shape for affecting the capacitive sensing device in a substantially uniform manner. The tactile feedback element is coupled to the surface and disposed such that the tactile feedback element contacts the deflected portion of the finger to provide tactile feedback to the finger only when the finger is sufficiently deflected into the finger receiving recess to actuate the capacitive sensing device.

Figure 1:
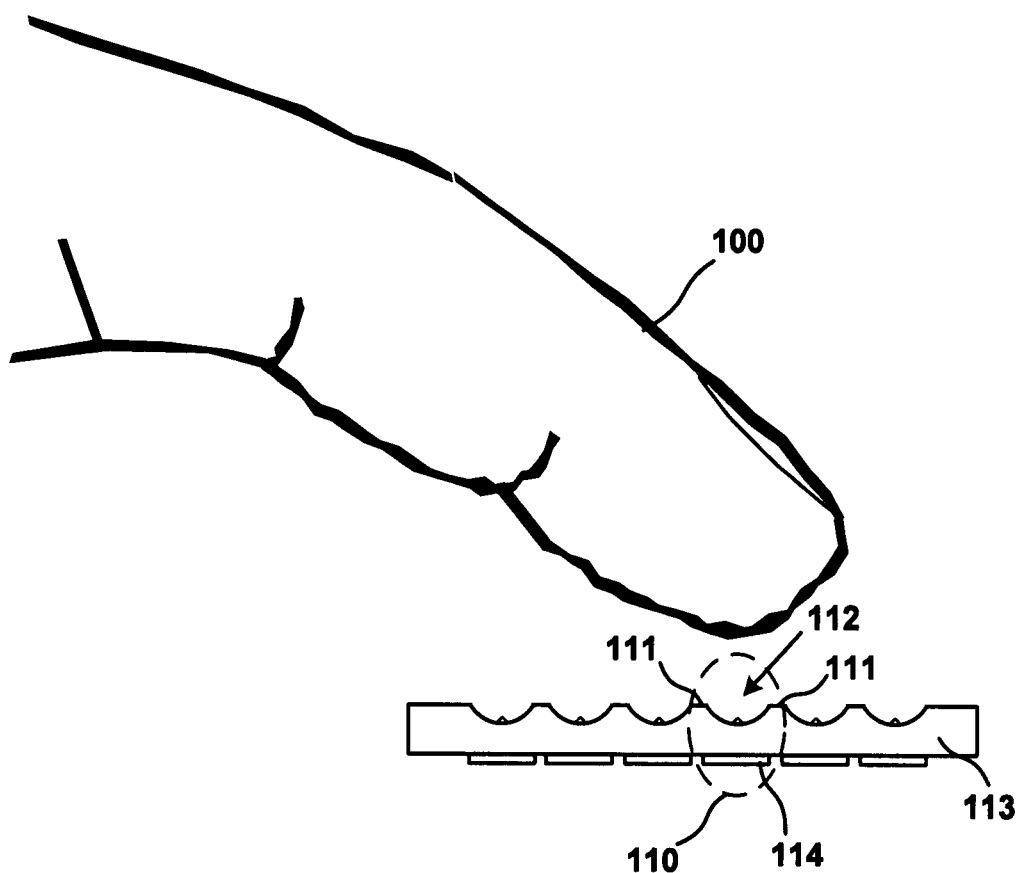
FIG. 1 shows a finger above a sectional view of a capacitive sensing device with a tactile feedback apparatus, according to an embodiment.

The drawings referred to in this description should not be understood as being drawn to scale except if specifically noted.

DETAILED DESCRIPTION

Reference will now be made in detail to embodiments of the presented technology, examples of which are illustrated in the accompanying drawings. While the presented technology will be described in conjunction with embodiments, it will be understood that they are not intended to limit the presented technology to these embodiments. On the contrary, the presented technology is intended to cover alternatives, modifications and equivalents, which may be included within the spirit and scope of the presented technology as defined by the appended claims. Furthermore, in the following detailed description, numerous specific details are set forth in order to provide a thorough understanding of the presented technology. However, it will be obvious to one of ordinary skill in the art that the presented technology may be practiced without these specific details. In other instances, well known methods, procedures, components, and circuits have not been described in detail as not to unnecessarily obscure aspects of the presented technology.

Overview of Discussion

Discussion will begin with a top-level description of a capacitive sensing device with a tactile feedback apparatus. Example configurations of various elements of the tactile feedback apparatus will then be discussed in greater detail. The function and operation of a capacitive sensing device with an example tactile feedback apparatus, according to one embodiment, will be described. Discussion will then be directed toward some example implementations of capacitive sensing devices which provide tactile feedback.

For input devices described herein which accept input from one or more user digits and/or other stimuli, a measurable capacitance often represents the total effective capacitance from a sensing node to the local ground of the system ("absolute capacitance"). The total effective capacitance for input devices can be quite complex, involving capacitances, resistances, and inductances in series and in parallel as determined by the sensor design and the operating environment. In other cases, the measurable capacitance may represent the total effective capacitance from a driving node to a sensing node ("trans-capacitance"). This total effective capacitance can also be quite complex. However, in many cases the input can be modeled simply as a small variable capacitance in parallel with a fixed background capacitance and a trans-capacitance.

For purposes of the present application the term "button" is intended to refer to an analog sensor of capacitance that responds to contact or proximity of a user digit or appendage. In some cases, the "button" may have a threshold which triggers responsive to the user digit or appendage via pressure, contact area, or proximity which is sensed through one or more capacitive sensing techniques. In many instances the capacitance sensing devices with tactile feedback, which are described herein, take the form of such buttons.

Top-Level Description

FIG. 1 shows a finger 100 above a sectional view of a capacitive sensing device 110 with a tactile feedback apparatus according to an embodiment. Capacitive sensing device 110 is comprised of a finger receiving recess 112 defined in a surface 111 of a dielectric insulator 113. Capacitive sensor electrode 114 is disposed below finger receiving recess 112 and coupled to dielectric insulator 113.

Capacitive sensing device 110 is actuated by a user pressing an appendage, such as finger 100, against finger receiving recess 112. As will be described herein a portion of finger 100 is then deflected into finger receiving recess 112 by one or more deflecting features of finger receiving recess 112, as a consequence of the pressing. Deflecting less than that required to actuate the sensing device provides user feedback from the deflecting feature and can prevent inadvertent actuate. When a user presses harder with finger 100, finger 100 deflects until it contacts a tactile feedback element disposed within finger receiving recess 112. The contact with the tactile feedback element provides feedback to the user to indicate that finger 100 has been sufficiently deflected into finger receiving recess 112 to actuate capacitive sensing device 110.

Finger receiving recess 112 is shown in FIG. 1 (and elsewhere herein) as being operated by a finger 100. For purposes of brevity and clarity, embodiments are shown and described as being operated by finger 100; however it is appreciated that embodiments of finger receiving recess 112, as discussed herein, are also well suited for being operated by a variety of appendages, such as fingers, thumbs, palms, feet, toes, and the like. Other ridges and tactile elements for allowing a user to align to the sensors may also be included outside of the capacitive sensing device.

Detail views of portions of capacitive sensing device 110 are shown in FIGS. 2A-2D, 3A-3C, and 4A-4C to illustrate and explain various examples of finger deflecting features and tactile feedback elements. It is appreciated that like numbered elements in these detail views, and throughout the specification and figures, refer to the same or similar elements. Other figures illustrate various examples of electrode patterns and coupled dielectric assemblies.

Example Configurations

FIGS. 2A, 2B, 2C, and 2D are detail sectional views of a capacitive sensing device with a tactile feedback apparatus, according to various embodiments.

Figure 2A:
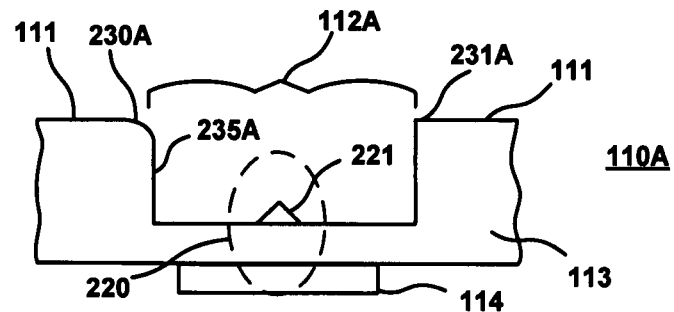
FIGS. 2A, 2B, 2C, 2D, 2E, 2F and 2G are alternative views of a variety of configurations of a capacitive sensing device with a tactile feedback apparatus, according to various embodiments.

FIG. 2A shows detail 110A, which is an example of one embodiment of a capacitive sensing device with a tactile feedback apparatus. Capacitive sensing device 110A is comprised of a finger receiving recess 112A defined in surface 111 of dielectric material 113. Finger receiving recess 112A is for receiving a deflected portion of a finger or other digit. Capacitive sensor electrode 114 is disposed below finger receiving recess 112 to sense a finger or other digit, which is deflected into finger receiving recess 112A.

As demonstrated by finger receiving recess 112A, in some embodiments, a cross-section of a (e.g. cylindrical) finger receiving recess is substantially rectangular. Finger receiving recess 112A is comprised of an interior contact surface 235A, at least one finger deflecting feature (230A, 231A) disposed on an upper edge of finger receiving recess 112A or within finger receiving recess 112A, and a tactile feedback element 221. As shown in FIG. 2A (and throughout), interior contact surface 235A is a continuation of surface 111, however it is appreciated that in some co-molded or laminated embodiments interior contact surface 235A may be formed of a separate piece of dielectric material than the piece of dielectric material which forms surface 111. As shown by finger deflecting feature 230A, in some embodiments, a finger deflecting feature slopes smoothly or curves smoothly inward into a finger receiving recess, such as finger receiving recess 112A. As shown by finger deflecting feature 231A, in some embodiments, a finger deflecting feature forms a sharper edge which distinctly drops off into a finger receiving recess, such as finger receiving recess 112A.

Finger receiving recess 112A is structured such that a variety of finger sizes pressed into finger receiving recess 112A will be deflected into a predictable and repeatable shape for affecting coupling to capacitive sensor electrode 114 of device 110A in a predictable manner. For instance, in operation, a variety of finger sizes will be repeatedly deflected into a predictable shape before coming into contact with tactile feedback element 221 and positively sensed as an actuation of capacitive sensing device 110A by capacitive sensor electrode 114. The deflection may also provide feedback or otherwise prevent accidental actuation.

Figure 4A:
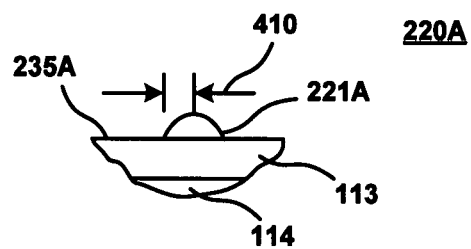
FIGS. 4A, 4B, and 4C are detail sectional views of various alternate embodiments of a tactile feedback element.
Figure 4B:
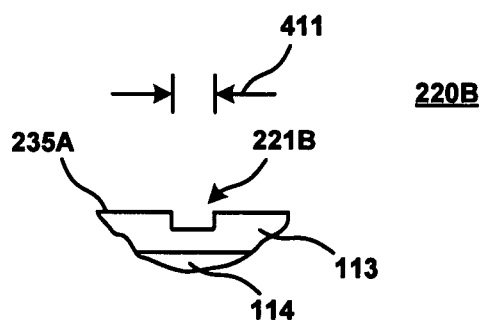
Figure 4C:
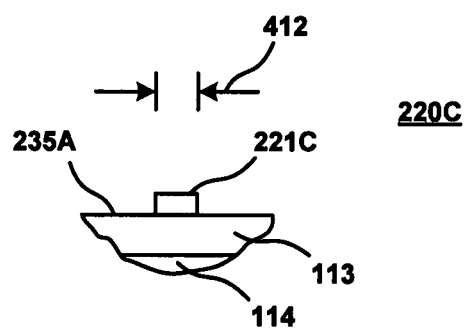

As shown in FIG. 2A, in one embodiment, tactile feedback element 221 is a protrusion which is triangular in cross-section (e.g. conical or pyramidal in shape). It is appreciated that a variety of a tactile feedback element shapes and configurations may be utilized to provide tactile feedback in accordance with various embodiments. FIGS. 4A-4C show several example configurations of a tactile feedback element as alternative detail views of detail 220. More than one tactile element and more than one type may be included for a variety of tactile effects. In one embodiment, as shown, tactile feedback element 221 is disposed near a bottom portion of finger receiving recess 112.

Figure 2B:
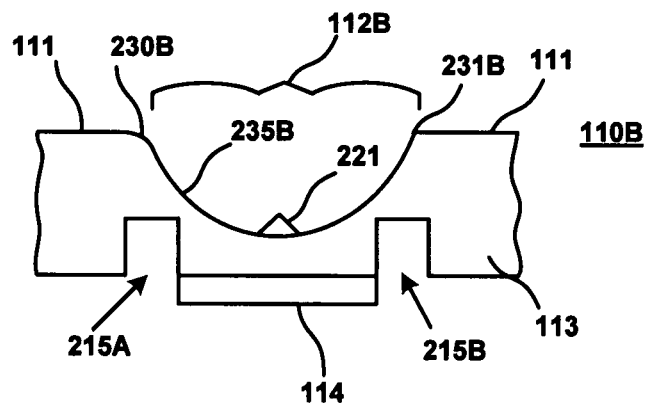

FIG. 2B shows detail 110B, which is an example of one embodiment of a capacitive sensing device with a tactile feedback apparatus. Capacitive sensing device 110B is comprised of a finger receiving recess 112B defined in surface 111 of dielectric material 113. Finger receiving recess 112B is for receiving a deflected portion of a finger or other digit. Capacitive sensor electrode 114 is disposed below finger receiving recess 112B to sense a finger 100, or other digit, which is deflected into finger receiving recess 112B.

As demonstrated in the diagram of finger receiving recess 112B, in some embodiments, a cross-section of a finger receiving recess is circularly curved (e.g. hemispherical). Finger receiving recess 112B is comprised of an interior contact surface 235B, at least one finger deflecting feature (230B, 231B) disposed on an upper edge of finger receiving recess 112B or within finger receiving recess 112B, and a tactile feedback element 221. As shown in FIG. 2B, interior contact surface 235B is a continuation of surface 111, however it is appreciated that in some co-molded or laminated embodiments interior contact surface 235B may be formed of a separate piece of dielectric material than the piece of dielectric material which forms surface 111. As shown by finger deflecting feature 230B, in some embodiments, a finger deflecting feature slopes smoothly or curves smoothly inward into a finger receiving recess, such as finger receiving recess 112B. As shown by finger deflecting feature 231B, in some embodiments, a finger deflecting feature forms a sharper edge which distinctly drops off into a finger receiving recess, such as finger receiving recess 112B.

Finger receiving recess 112B is structured such that a variety of finger sizes pressed into finger receiving recess 112B will be deflected into a predictable and repeatable shape for affecting the coupling to capacitive sensor electrode 114 of device 110B in a predictable manner. For instance, in operation, a variety of finger sizes will be repeatedly deflected into a predictable shape before coming into contact with tactile feedback element 221 and positively sensed as an actuation of capacitive sensing device 110B by capacitive sensor electrode 114.

Interior contact surface 235B provides one example of a contoured interior contact surface which is contoured for receiving contact from a deflected portion of finger. The contoured concave shape of interior contact surface 235B is similar to the deflected shape that a finger will take on when deflected into finger receiving recess 112B. In one embodiment, a contoured interior contact surface, such as 235B, is utilized to maximize coupling between a deflected portion of a finger and a surface of dielectric, such as dielectric 113.

FIG. 2B also demonstrates how, in some embodiments, one or more recesses (215A, 215B) may be configured into a dielectric material, such as dielectric 113. In one embodiment a recess (215A, 215B), is used to affect capacitive coupling between a capacitive sensor electrode 114 and a deflected portion of a finger received in a finger receiving recess 112. In various embodiments such recesses (215A, 215B) may be configured as voids or may be filled with a material (such as a different dielectric material). In some embodiments, such recesses may be defined by an interior contact surface, such as interior contact surface 235B. Capacitive sensor electrode 114 may be disposed on the bottom surface, as shown, as well as being embedded in dielectric 113, laminated to dielectric surface 113, or other similar constructions.

Figure 2C:
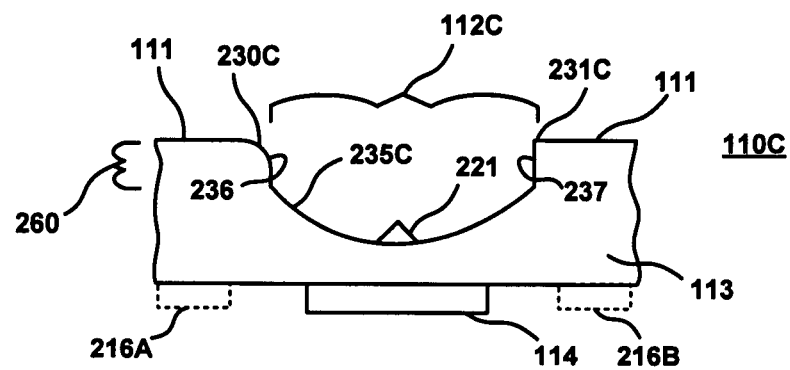

FIG. 2C shows detail 110C, which is an example of one embodiment of a capacitive sensing device with a tactile feedback apparatus. Capacitive sensing device 110C is comprised of a finger receiving recess 112C defined in surface 111 of dielectric material 113. Finger receiving recess 112C is for receiving a deflected portion of a finger or other digit. Capacitive sensor electrode 114 is disposed below finger receiving recess 112C to sense a finger or other digit, which is deflected into finger receiving recess 112C.

As demonstrated in by finger receiving recess 112C, in some embodiments, a cross-section of a finger receiving recess may employ one or more elements of relief, for a depth, such as depth 260, to define one or more portions (236, 237) of interior contact surface shape. Finger receiving recess 112C is comprised of an interior contact surface 235C, at least one finger deflecting feature (230C, 231C, 236, 237) disposed on an upper edge of finger receiving recess 112C or within finger receiving recess 112C, a tactile feedback element 221. As shown in FIG. 2C, interior contact surface 235C is a continuation of surface 111, however it is appreciated that in some co-molded or laminated embodiments interior contact surface 235C may be formed of a separate piece of dielectric material than the piece of dielectric material which forms surface 111. As shown by finger deflecting feature 230C, in some embodiments, a finger deflecting feature slopes smoothly or curves smoothly inward into a finger receiving recess, such as finger receiving recess 112C. As shown by finger deflecting feature 231C, in some embodiments, a finger deflecting feature forms a sharper edge which distinctly drops off into a finger receiving recess, such as finger receiving recess 112C.

Finger receiving recess 112C is structured such that a variety of finger sizes pressed into finger receiving recess 112C will be deflected into a predictable and repeatable shape for affecting the coupling to capacitive sensor electrode 114 of device 110C in a predictable manner. For instance, in operation, a variety of finger sizes will be repeatedly deflected into a predictable shape before coming into contact with tactile feedback element 221 and positively sensed as an actuation of capacitive sensing device 110C by capacitive sensor electrode 114. Optionally, other electrodes such as 216A and 216B may also be used to guard capacitive sensor electrode 114 from extraneous signals, be used as additional sensors to modify its response (e.g. inhibit), or combine with its response (e.g. to encode more than one button per sensing electrode). Electrodes 216A and 216B may be coupled to a ground (when used as shields), or to a varying voltage (when used as an active guard). Shielding and guarding techniques are well known in the art. Such electrodes may also be embedded in dielectric 113.

Interior contact surface 235C provides another example of a contoured interior contact surface which is contoured for receiving contact from a deflected portion of a finger. The contoured concave shape of interior contact surface 235C is similar to the deflected shape that a user digit, such as a finger, will take on when deflected into finger receiving recess 112C to contact tactile feedback element 221. In one embodiment, a contoured interior contact surface, such as 235C, is utilized to maximize coupling between a deflected portion of a finger and a surface of dielectric, such as dielectric 113.

Figure 2D:
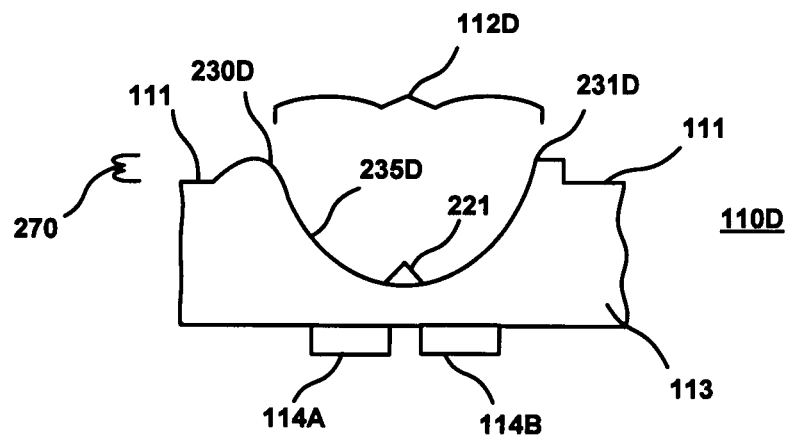

FIG. 2D shows detail 110D, which is an example of one embodiment of a capacitive sensing device with a tactile feedback apparatus. Capacitive sensing device 110D is comprised of a finger receiving recess 112D defined in surface 111 of dielectric material 113. Finger receiving recess 112D is for receiving a deflected portion of a finger or other digit. Capacitive sensor electrodes 114A and 14B are disposed below finger receiving recess 112D to sense a finger or other digit, which is deflected into finger receiving recess 112D.

Multiple sensor electrodes may allow for trans-capacitive or differential capacitance sensing. These electrodes may also be embedded in dielectric 113. Multiple electrodes may be arranged (e.g. concentrically, and radially) to better resolve the deflection of the finger into the finger receiving recess.

Finger receiving recess 112D is comprised of an interior contact surface 235D at least one finger deflecting feature (230D, 231D) disposed on an upper edge of finger receiving recess 112D, and a tactile feedback element 221. The raised finger deflecting features may also serve as tactile alignment features for user discovery of sensor location. It is appreciated that other features not intended for finger deflection (in the context of the presently described finger deflecting technology) may also serve as tactile alignment features. As shown in FIG. 2D, interior contact surface 235D is a continuation of surface 111, however it is appreciated that in some co-molded and laminated embodiments interior contact surface 235D may be formed of a separate piece of dielectric material than the piece of dielectric material which forms surface 111. As shown by finger deflecting feature 230D, in some embodiments, a finger deflecting feature slopes smoothly or curves smoothly inward into a finger receiving recess, such as finger receiving recess 112D. As shown by finger deflecting feature 231D, in some embodiments, a finger deflecting feature forms a defined edge which sharply drops off into a finger receiving recess, such as finger receiving recess 112D.

Finger receiving recess 112D is structured such that a variety of finger sizes pressed into finger receiving recess 112D will be deflected into a predictable and repeatable shape for affecting capacitive sensor electrodes 214A, 214B of device 100D in a predictable manner. For instance, in operation, a variety of finger sizes will be repeatedly deflected into a predictable shape before coming into contact with tactile feedback element 221 and positively sensed as an actuation of capacitive sensing device 110D by capacitive sensor electrodes 214A, 214B.

Interior contact surface 235D provides another example of a contoured interior contact surface which is contoured for receiving contact from a deflected portion of a finger. The contoured concave shape of interior contact surface 235D is similar to the deflected shape that a finger will take on when deflected into finger receiving recess 112D. In one embodiment, a contoured interior contact surface, such as 235D, is utilized to maximize contact between a deflected portion of a finger and a surface of dielectric, such as dielectric 113. In some embodiments, additional finger defining features or additional tactile elements may be disposed within finger receiving recess 112D.

As demonstrated by finger receiving recess 112D, in some embodiments, one or more finger deflecting feature (such as finger deflecting features 230D and 231D) may be raised a distance (such as distance 270) above a portion of a surrounding surface 111. In one embodiment, as shown, a finger deflecting feature (230D for instance) comprises a raised protrusion (in this case raised by distance 270) disposed along at least a portion of an opening defined in surface 111 by finger receiving recess 112. This raised protrusion is useful for providing additional tactile definition to an edge of a finger receiving recess 112. In one embodiment adding a raised protrusion to a finger deflecting feature (230D, 231D) allows a finger receiving recess 112 to be configured at a shallower depth relative to a surrounding surface 111. This may reduce the relative capacitive sensor electrode coupling of objects inadvertently placed near dielectric surface 111.

Figure 2E:
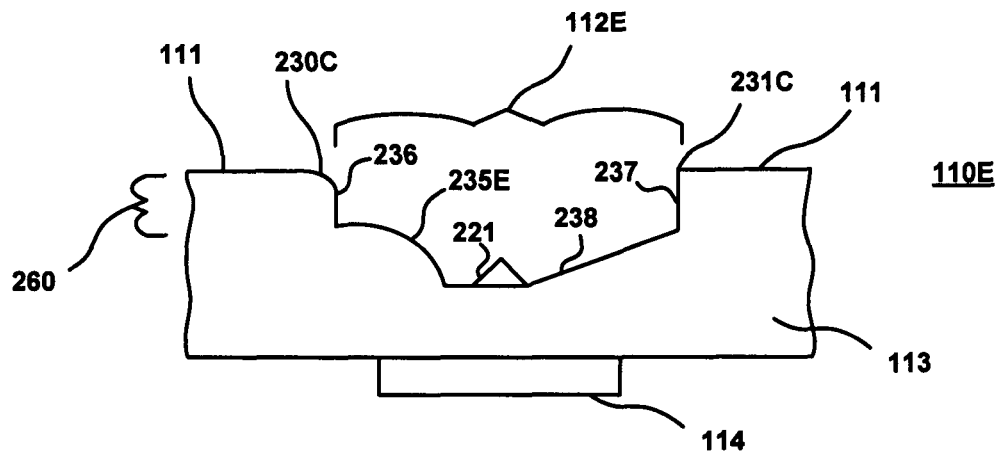

FIG. 2E shows detail 110E, which is an example of one embodiment of a capacitive sensing device with a tactile feedback apparatus. In FIG. 2E, like numbers are utilized to identify previously described elements. Capacitive sensing device 110E is comprised of a finger receiving recess 112E defined in surface 111 of dielectric material 113. Finger receiving recess 112E is for receiving a deflected portion of a finger or other digit. Capacitive sensor electrode 114 is disposed below finger receiving recess 112E to sense a finger or other digit, which is deflected into finger receiving recess 112E. As previously described, multiple capacitive sensor electrodes may allow for trans-capacitive or differential capacitance sensing.

FIG. 2E is similar to FIG. 2C, and is included to demonstrate an embodiment where a finger receiving recess 112E comprises a cross-section of a (e.g. roughly conical) finger receiving recess which has an sloping interior portion 238 which is substantially triangular or trapezoidal or has a bulging interior ridge 235E which otherwise comes close to contact with a finger when it is deflected into the finger receiving recess to contact tactile feedback element 221. For example, an interior ridge, such as bulging interior ridge 235E or sloping interior portion 238, may be included to increase the capacitive response before a user digit or appendage, such as a finger, makes contact with tactile feedback element 221. FIG. 2E also demonstrates that interior surfaces of a finger receiving recess are not required to be symmetrical, and may have internal ridges such that the deflected shape of a finger will contact (or nearly contact) when deflected into a finger receiving recess to contact tactile element.

Figure 2F:
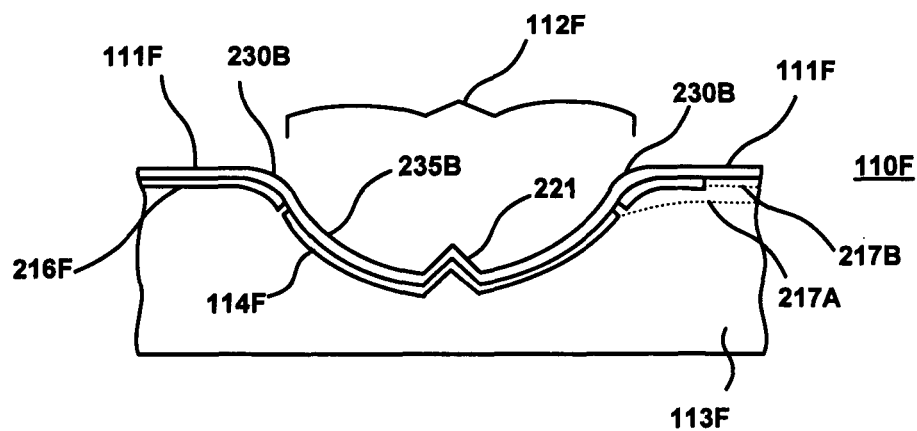

FIG. 2F shows detail 110F, which is an example of one embodiment of a capacitive sensing device with a tactile feedback apparatus. In FIG. 2F, like numbers are utilized to identify previously described elements. Capacitive sensing device 110F is comprised of a finger receiving recess 112F defined in surface 111F of dielectric material 113F. Finger receiving recess 112F is for receiving a deflected portion of a finger or other digit.

FIG. 2F demonstrates how a substantially circular finger receiving recess with a roughly hemispherical cross-section may, in some embodiments, be assembled as a laminate of a flexible printed circuit on a dielectric support. For example, capacitive sensor electrode 114F and guard electrode 216F are disposed below finger receiving recess 112F to sense a finger or other digit which is deflected into finger receiving recess 112F. In the example shown, dielectric material 113F provides a support structure, and surface 111F comprises a dielectric laminate layer. Dashed line 217A represents a circuit trace coupled to capacitive sensor electrode 114F. Likewise, dashed line 217B represents a circuit trace coupled to guard electrode 216F. As previously described, multiple capacitive sensor electrodes may allow for trans-capacitive or differential capacitance sensing. Although circuits shown in FIG. 2F are shown as a single pattern electrode layer, it is appreciated that they can also be formed with multilayer techniques.

Figure 2G:
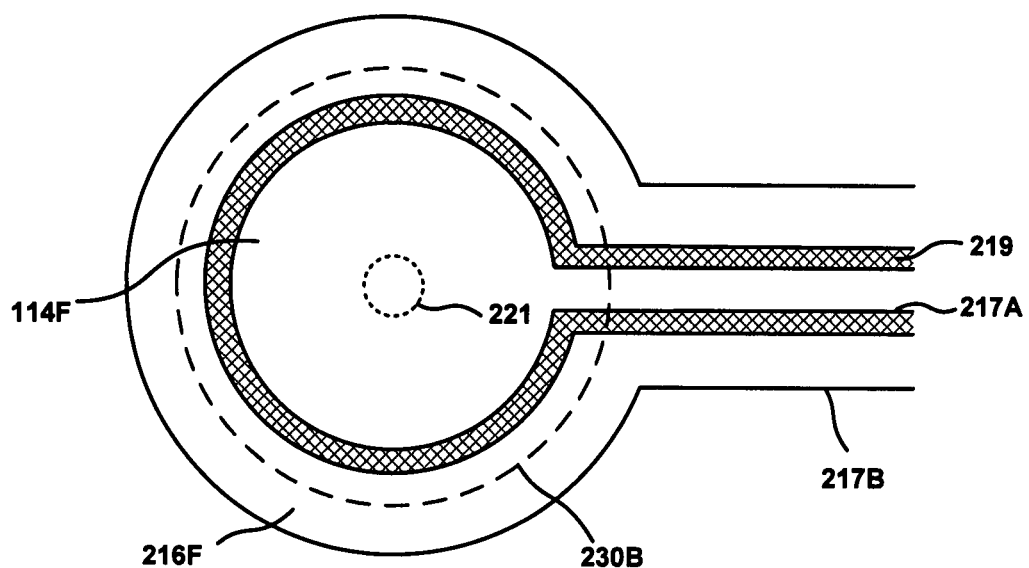

FIG. 2G shows a top view of the guard and sensing electrodes of detail 110F. In FIG. 2G, like numbers are utilized to identify previously described elements. Dashed line 221 represents the approximate location of tactile feedback element 221 relative to the single patterned electrode layer of FIG. 2G. Dashed line 230B represents the approximate location of finger defining edge 230B relative to the single patterned electrode layer of FIG. 2G. Cross-hatched region 219 represents a gap between sensor electrode 114F and guard electrode 216F.

Figure 3A:
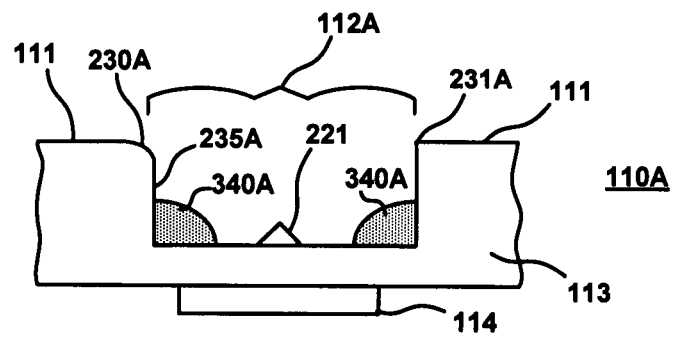
FIGS. 3A, 3B, and 3C are detail sectional views of an example capacitive sensing device with a tactile feedback apparatus configured with a conformal, deformable dielectric, according to various embodiments.
Figure 3B:
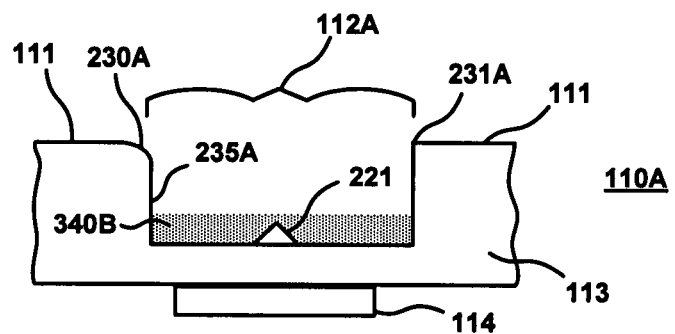
Figure 3C:
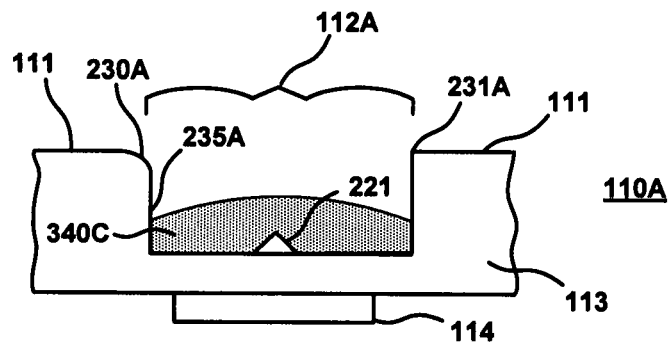

FIGS. 3A, 3B, and 3C are detail sectional views of an example capacitive sensing device with a tactile feedback apparatus configured with a conformal, deformable dielectric, according to various embodiments. In FIGS. 3A, 3B, and 3C elements 111, 112A, 113, 114, 221, 230A, 231A, and 235A of capacitive sensing device 110A are the same as shown and described in conjunction with FIG. 2A. It is appreciated that other embodiments of a finger receiving recess 112 may be filled with a conformal dielectric in a manner similar to the examples illustrated by FIGS. 3A, 3B, and 3C. The conformal dielectric will deflect and be deflected by a finger actuating the sensing device.

FIG. 3A illustrates an embodiment where a portion of finger receiving recess 112A is filled with a conformal dielectric material disposed in bulges 340A. In one embodiment, conformal dielectric material 340A is used to shape capacitive coupling between a deflected portion of a finger 100 and a capacitive sensor electrode 114. Another use of conformal dielectric material 340A is to soften the feel of the contact between a deflected portion of a finger and a tactile feedback element 221 disposed within finger receiving recess 112A. Yet another use of conformal dielectric material 340A, in one embodiment, is to provide additional tactile sensation to a deflected portion of a finger or other digit. As shown in FIG. 3A, in one embodiment, bulges 340A allow for an increased ratio of coupling to the capacitive sensing electrode between the position when a finger contacts the bulges 340A and when a deflected portion of a finger comes into contact with protruding tactile feedback element 221. It is appreciated that bulges 340A may be scaled up or down from the size shown and may surround or form a finger receiving recess 112A in the shape of a washer or donut. For example, in one embodiment, bulges 340A protrude out of finger receiving recess 112A, and above the level of surface 111. In such an embodiment, bulges 340A may act not only as a conformal dielectric, but also as a finger deflecting feature. Furthermore, it is possible to suspend a thin membrane over the surface of the finger receiving recess which will deflect with a finger into the recess during operation.

FIG. 3B illustrates an embodiment where a portion of finger receiving recess 112A is filled with a conformal dielectric material 340B. The difference between FIG. 3A and FIG. 3B is the shape of conformal dielectric 340B. In this embodiment the conformal dielectric is shaped to contact the finger so that a deflected portion of a finger is guaranteed to be deflecting conformal dielectric 340B when the deflected portion of the finger comes into contact with protruding tactile feedback element 221. Conformal dielectric 340B allows for an increased ratio of coupling to capacitive sensing electrode 114 between the position when a finger enters recess 112A and the position when a deflected portion of a finger comes into contact with protruding tactile feedback element 221.

FIG. 3C illustrates an embodiment where a portion of finger receiving recess 112A is filled with a conformal dielectric material 340C. The main difference between FIG. 3B and FIG. 3C is the higher fill level of conformal dielectric 340C. At this higher fill level, the conformal dielectric is shaped to deflect the finger as it enters the finger receiving recess near the level of surrounding surface 111. A deflected portion of a finger is guaranteed to be deflecting conformal dielectric 340C when the deflected portion of the finger comes into contact with protruding tactile feedback element 221. An additional benefit to filling more of finger receiving recess 112A with a conformal dielectric material is that debris accumulation in finger receiving recess 112A will be reduced or eliminated. In one instance, conformal dielectric 340C also provides a tactile feature to align the finger to the sensing device. Such a reduction of debris and proper finger alignment will assist in uniform and consistent operation of capacitive sensing. Conformal dielectric 340C allows for an increased ratio of coupling to capacitive sensing electrode 114 between the position when a finger enters finger receiving recess 112A and the position when a deflected portion of a finger comes into contact with protruding tactile feedback element 221.

FIGS. 4A, 4B, and 4C are detail sectional views of various embodiments of a tactile feedback element. In FIGS. 4A, 4B, and 4C elements 113, 114, and 235A of capacitive sensing device 110A are the same as shown and described in conjunction with FIG. 2A. Though the detail sectional views of FIGS. 4A, 4B, and 4C are associated with capacitive sensing device 110A of FIG. 2A, it is appreciated that the embodiments of tactile feedback elements 221 illustrated in FIGS. 4A, 4B, and 4C may be utilized with other embodiments of a capacitive sensing device 110.

As shown in FIG. 4A, in one embodiment, tactile feedback element 221A is a convex protrusion when viewed in cross-section. A finger is capable of sensing and identifying contact with a curved surface, as long as the radius of curvature, shown by distance 410, is not too large. A smaller radius of curvature results in a more pointed cone shape convex surface. Conversely, a larger radius of curvature results in a larger, more gently curved convex surface. Because of this, in one embodiment, when a convex protruding tactile feedback element 221A is utilized, the tactile feedback element 221A has a radius of curvature of no more than five millimeters. This limitation on maximum radius of curvature ensures that the surface of tactile feedback element 221A is not so gradually curved that a finger 100 has a difficult time sensing the difference between contact with tactile feedback element 221A and a portion of the interior contact surface 235A of finger receiving recess 112A. In one embodiment, as shown, tactile feedback element 221A is disposed near a bottom portion of finger receiving recess 112A.

As shown in FIG. 4B, in one embodiment, tactile feedback element 221B is a recess or indentation defined within surface 235A. In one embodiment, a recessed tactile feedback element 221B has a rectangular shape when viewed in cross-section. However, it is appreciated that recessed tactile feedback element 221B is shown as an example, and other embodiments of a recessed tactile feedback element may other shapes. It is important that a width 411 of the recessed tactile feedback element is large enough to be sensed by the deflected portion of a finger, but yet not so large as to prevent the deflected finger from sensing contact with tactile feedback element 221B. In one embodiment, as shown, tactile feedback element 221B is disposed near a bottom portion of finger receiving recess 112A. The convex corners of 221B provide the dominant tactile feedback.

As shown in FIG. 4C, in one embodiment, tactile feedback element 221C is a rectangular protrusion when viewed in cross-section. As with convex protruding tactile feedback element 221A, it is important that protruding tactile feedback element 221C not have too great a width 412, lest it be difficult for a finger or other digit to distinguish between contact with interior contact surface 235A and protruding tactile feedback element 221C. Thus in one embodiment, the maximum width 412 of protruding tactile feedback element 221C is limited to approximately four millimeters. In one embodiment, as shown, tactile feedback element 221C is disposed near a bottom portion of finger receiving recess 112A. The convex corners of 221C provide the dominant tactile feedback.

It is appreciated that the various embodiments of protruding tactile feedback elements described herein may be comprised, in some embodiments, of a rigid, semi-rigid, or flexible material. In some embodiments, a protruding tactile feedback element is comprised of a dielectric material, such as dielectric material 113. The tactile element may also be composite, and laminated or patterned onto a dielectric. The tactile element (e.g. 221), and the contact surface (e.g. 235) may also be composed of or covered by a conductor coupled capacitively to, but not ohmically connected to, the capacitive sensor electrode (e.g. 114).

Figure 12A:
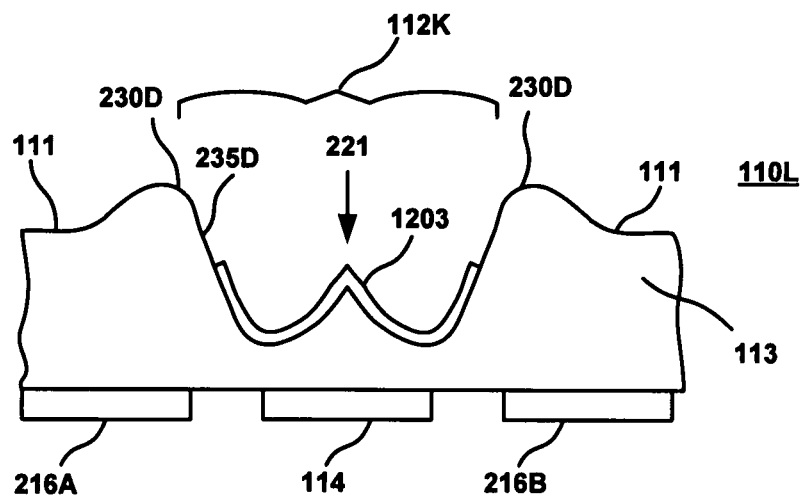
FIGS. 12A, 12B, and 12C show various examples of top surface conductors, according to some embodiments.
Figure 12B:
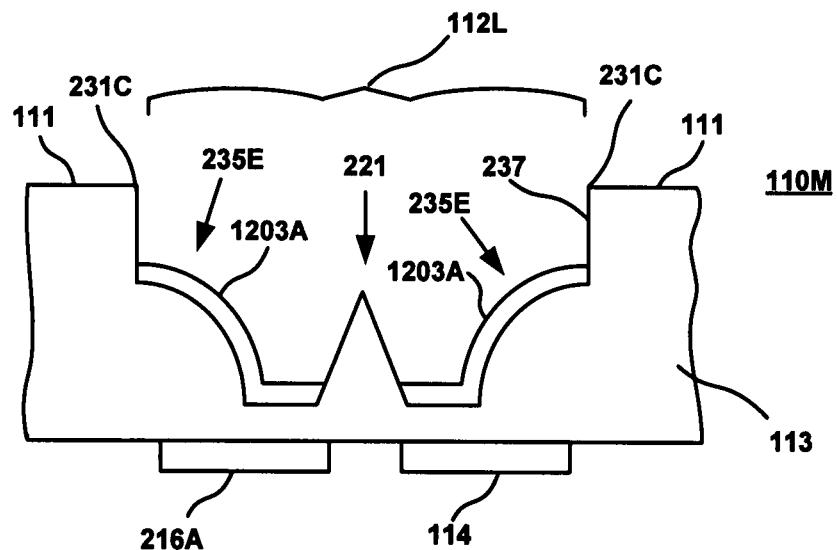
Figure 12C:
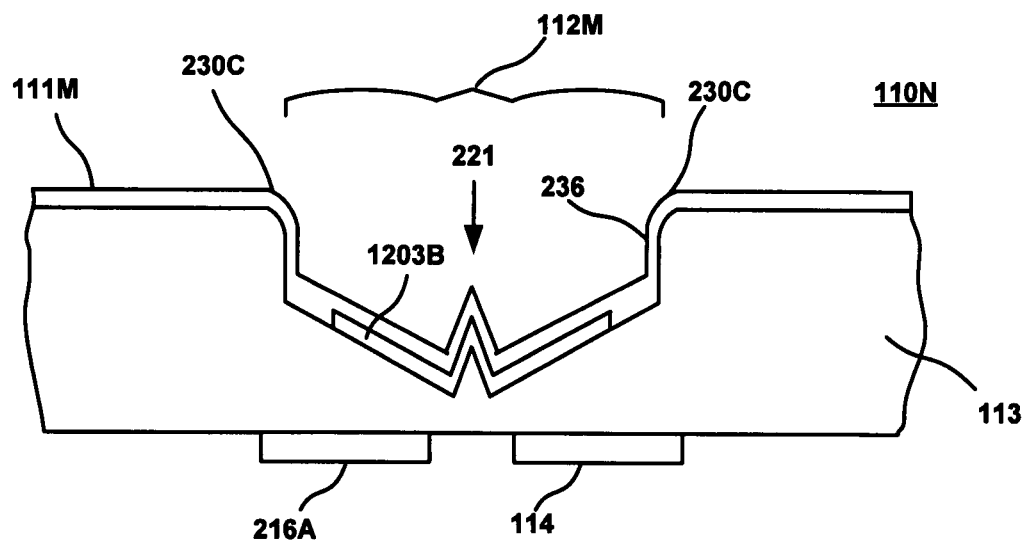

FIGS. 12A, 12B, and 12C are detail sectional views of example capacitive sensing devices with a tactile feedback apparatus configured with a top surface electrode, according to various embodiments. In FIGS. 12A, 12B, and 12C, like numbers are utilized to identify previously described elements.

FIG. 12A shows detail 110L, which is an example of one embodiment of a capacitive sensing device with a tactile feedback apparatus. FIG. 12A shows a detail view of a top surface conductor 1203 within finger receiving recess 112K. As shown, top surface conductor 1203 covers tactile feedback element 221. Top surface conductor 1203 is configured such that contact with, or high capacitive coupling of, a finger to top surface conductor 1203 on tactile feedback element 221 will significantly change the coupling to sensor electrode 114. Top surface electrode 1203 is floating, and capacitively couples with shield electrodes 216A and 216B. Top surface electrode 1203 tends to move in sync with the capacitance of the shield electrodes 216A and 216B until a finger comes into proximity or contact with tactile feedback element 221. Typically, the floating top surface conductor 1203 will have a capacitance in the pico Farad range (e.g., 2 pF). However, contact (or highly capacitive coupling) between a finger and top surface conductor 1203 causes the top surface conductor 1203 to become grounded through the finger, thus taking on a capacitance (from the finger) that is an order of magnitude higher (e.g., 20 pF or more) than that coupled from the shield electrodes 216A and 216B. This reduces false positive actuations, reduces sensitivity to hover of a finger within finger receiving recess 112K, and provides a sharper capacitive response to capacitive sensor electrode 114 when a finger contacts tactile feedback element 221.

FIG. 12B shows detail 110M, which is an example of one embodiment of a capacitive sensing device with a tactile feedback apparatus. FIG. 12B shows a detail view of a top surface conductor 1203A within a contoured finger receiving recess 112L such that contact with, or high capacitive coupling of, a finger to interior ridges/bulges 235E will significantly change the capacitive coupling to sensor electrode 114. Device 110M possesses a different form factor, but functions in the same fashion as device 110L.

FIG. 12C shows detail 110N, which is an example of one embodiment of a capacitive sensing device with a tactile feedback apparatus. FIG. 12C shows a detail view of a laminated top surface conductor 1203B within a conical finger receiving recess 112M such that finger contact with tactile feedback element 221, or high capacitive coupling of a finger in close proximity to laminated top surface conductor 1203B, will significantly change the coupling to sensor electrode 114. Device 110N possesses a different form factor, but functions in the same fashion as device 110L. Additionally, laminate 111M prevents exposure of conductor 1203B; this reduces scratches, wear, and oxidation as compared to an exposed top surface conductor. Laminate 111M is a dielectric material which may be evaporated, deposited, glued, or otherwise affixed to cover top surface conductor 1203B. Likewise a conductive hard coating can be applied as an additional or alternative element.

Example of Function and Operation

Figure 5A:
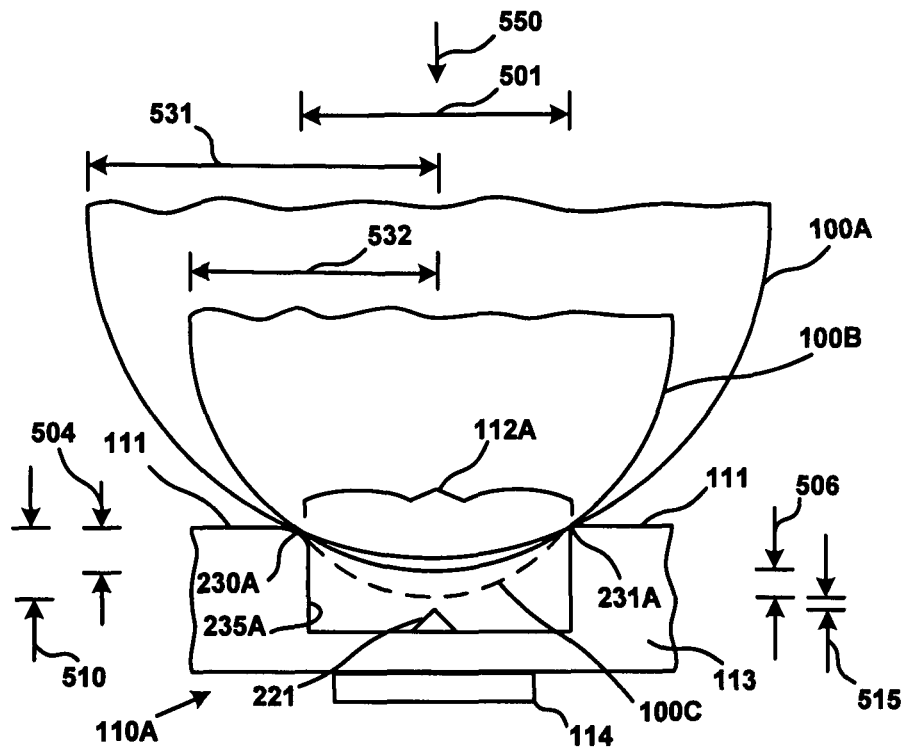
FIGS. 5A, 5B, 5C, and 5D show large and small fingers utilizing a capacitive sensing device with a tactile feedback apparatus, according to an example embodiment.
Figure 5B:
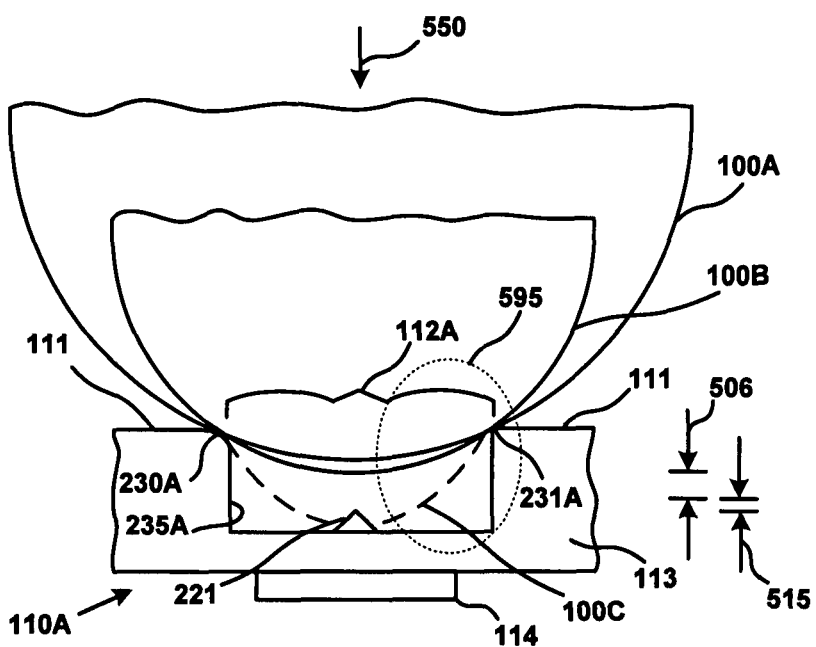

FIGS. 5A and 5B show large 100A and small 100B fingers utilizing a capacitive sensing device with a tactile feedback apparatus, according to an embodiment. In FIGS. 5A and 5B elements 111, 112A, 113, 114, 221, 230A, 231A, and 235A of capacitive sensing device 110A are the same as shown and described in conjunction with FIG. 2A. While operation of a capacitive sensing device with a tactile feedback element is illustrated using capacitive sensing device 110A, it is appreciated that other embodiments of a capacitive sensing device with a tactile feedback element operate in a similar fashion.

FIGS. 5A and 5B show a large finger 100A with a radius of curvature (R1) 531 of less than 12.5 mm and a small finger 100B with a radius of curvature (R2) 532 of greater than 4 mm. It is appreciated that a range of fingers with curvatures between that of finger 100A and that of finger 100B may be optimally used with capacitive sensing device 110A. When large finger 100A or small finger 100B (or even some fingers of sizes and shapes outside that range) is pressed substantially in direction 550 into finger receiving recess 112A, finger defining edges such as 230A and 231A act on the inherently pliable flesh of the respective finger to deflect it into a single predictable and repeatable shape approximating 100C. Without deflection, fingers with radius R1 and R2 would penetrate into the recess by depths D1 and D2 such that D2 is larger than D1.

When a finger is compressed, such as into finger receiving recess 112A, it can be modeled as a membrane constrained at the edges. In the case of finger receiving recess 112A, the edges of a compressed finger are constrained by finger deflecting features 230A and 231A. The starting shape of a finger, before compression, is roughly hemispherical or ovoid along any direction and roughly elliptical in cross-section, as shown by the simplified arcs of fingers 100A and 100B. Constraining a finger on two edges, or around a perimeter, and increasing finger pressure (as is normally done when pressing a button), causes the pressure to rise, and the finger to deflect in a roughly parabolic (in cross-section) manner between the constraining edges. This parabolic shape and increasing curvature is represented by deflected finger portion 100C. The parabolic addition to the finger shape increases the curvature of the finger between the constraining edges, and allows a large finger to be conformed to small curvatures. For example, with adequate pressure, a larger adult finger can conform to a curvature greater than that of the finger of a small child.

Because a repeatable deflected finger shape is substantially uniform in nature across different finger sizes, as represented by deflected finger portion 100C, it offers other advantages. One of the advantages is increased resistance to hover over a capacitive sensor (such as capacitive sensor electrode 114), because an appropriate determination or threshold can be more repeatably defined. Another advantage, when paired with a similarly shaped dielectric contact surface such as interior contact surface 235B (FIG. 2B), is an increase in the capacitive response curve through dielectric material, such as dielectric insulating material 113.

In one embodiment, finger receiving recess 112A has a maximum recess width (W) 501 of approximately 6 mm. This maximum recess width ensures functionality with a wide variety of finger sizes and precludes most small fingers from being inserted into finger receiving recess 112A and contacting tactile feedback element 221 without contacting finger deflecting features 230A and 231A. In one embodiment, the maximum recess width 501, as defined by the shortest distance between finger deflecting features 230A and 231A, is less than approximately 10 mm. For an embodiment this means that the penetration of the recess 112A by a finger 100B of radius R2 (532) to a depth of D2 will be more than D1 for a larger finger, but less than a threshold depth D3.

Small finger 100B, because of its smaller size, has a greater depth of recession (DS) 504 into finger receiving recess 112A than large finger 100A. In other words, small finger 100B can be inserted further into finger receiving recess 112A before finger deflecting features 230A and 231A begin to deflect it into predictable repeatable shape 100C since it needs to be deflected less. Thus, DS 504 represents a worst case accidental penetration of a finger into a finger receiving recess 112A. In one embodiment, DS is substantially equivalent to 1.5 mm, so an exemplary threshold penetration depth DT would be at or below that.

The design of capacitive sensing device 110A is such that actuation may occur some time before deflected finger portion 100C comes into contact with tactile feedback element 221. In other designs (e.g. those with guards or additional sensors) another finger deflection threshold may be between the point of contact with the tactile feedback element and the point where the finger is fully compressed into the receiving recess. To prevent inadvertent actuation, an accidental contact margin (M) 506 is built in to the design of capacitive sensor 110A, such that a capacitance attributable to a finger (100A, 100B) deflected only partially to the lowest point of accidental contact margin 506 will not cause actuation of capacitive sensor 110A. The contact margin lies between the threshold penetration depth, and the depth to which the smallest expected finger penetrates the finger receiving recess without deflection.

The lowest point of accidental contact margin 506 coincides with the upper point of finger deflection margin 515 at the finger deflection threshold (DT). Finger deflection threshold (DT) is defined, in one embodiment, as the depth of small finger recession D2 plus the additional depth of the accidental contact margin M. In FIG. 5A, deflection threshold D2 is represented as depth 504 from surface 111. When deflected finger portion 100C is deflected past deflection threshold DT into finger deflection margin 515, it is presumed to be purposely inserted into finger receiving recess 112A and should trigger actuation at any point within range 515 and perhaps deeper.

The predictable and repeatable finger shape 100C allows the design of capacitive sensing device 110A to ensure sufficient capacitive coupling will occur between deflected finger portion 100C and capacitive sensor electrode 114 to cause actuation of capacitive sensing device 110A by the time deflected finger portion 100C contacts tactile feedback element 221. Thus, in one embodiment, capacitive sensor electrode 114 is configured to be optimally actuated by a finger in the range of sizes between large finger 100A and small finger 100B when the finger is deflected into finger receiving recess 112A beyond a threshold amount. As can be seen, in one embodiment, the threshold amount occurs at a depth in finger receiving recess 112A which is between the depth that an undeflected small finger 100A may penetrate while contacting a finger deflecting feature (230A, 231A), and the depth at which any deflected finger portion 100C will contact tactile feedback element 221.

As shown in FIGS. 5A and 5B, finger receiving recess 112A is defined in surface 111 of dielectric insulator 113, and is configured for receiving deflected finger portion 100C of a finger in the range of sizes between large finger 100A and small finger 100B. Finger receiving recess 112A is comprised of a finger deflecting feature (230A, 230B) and a tactile feedback element 221. Finger deflecting features 230A and 231A are coupled to surface 111 and structured such that a variety of finger sizes (as shown by large finger 100A and small finger 100B) pressed into finger receiving recess 112A will deflect into a predictable and repeatable shape (100C) for affecting capacitive sensing device 110A in a substantially uniform manner. As shown, tactile feedback element 221 is coupled to an exterior surface of dielectric 113, in this case, a continuing portion of surface 111 which forms an interior contact surface 235A of finger receiving recess 112A. Tactile feedback element 221 is disposed such that it contacts deflected finger portion 100C, as shown in FIG. 5B, to provide tactile feedback to finger 100A (or 100B) only when finger 100A (or 100B) is sufficiently deflected into finger receiving recess 112A to be sufficiently coupled to capacitive sensor electrode 114 to actuate capacitive sensing device 110A.

In FIGS. 5A and 5B, capacitive sensing device 110A is shown in cross-section and deflected finger portion 100C is show with a convex curvature. In some embodiments, such as when capacitive sensing device 100A has an oval or channel shape (as viewed from a plan view), the predictable and repeatable finger shape 100C is shaped substantially like a portion of a cylinder. In some embodiments, such as when capacitive sensing device 100A has a more rounded or circular shape (as viewed from a plan view), the predictable and repeatable finger shape 100C is shaped substantially like a portion of a hemisphere. The embodiments illustrated in FIGS. 5A and 5B along with the deflected shapes and their depths into the recess are examples showing approximations, and are presented herein to demonstrate how the finger deflecting ridges produce repeatable finger shape upon penetration into the finger receiving recess for a large range of different fingers. FIGS. 5A and 5B show deflections within finger receiving recess 12A. It is appreciated that a finger will typically also experience some deflection which is external to finger receiving recess 112A. Elements of detail area 595 are enlarged, and shown with example dimensions, in FIGS. 5C and 5D to further demonstrate some examples of the deflection (both internal and external to finger receiving recess 112A) of large finger 100A and small finger 100B.

Figure 5C:
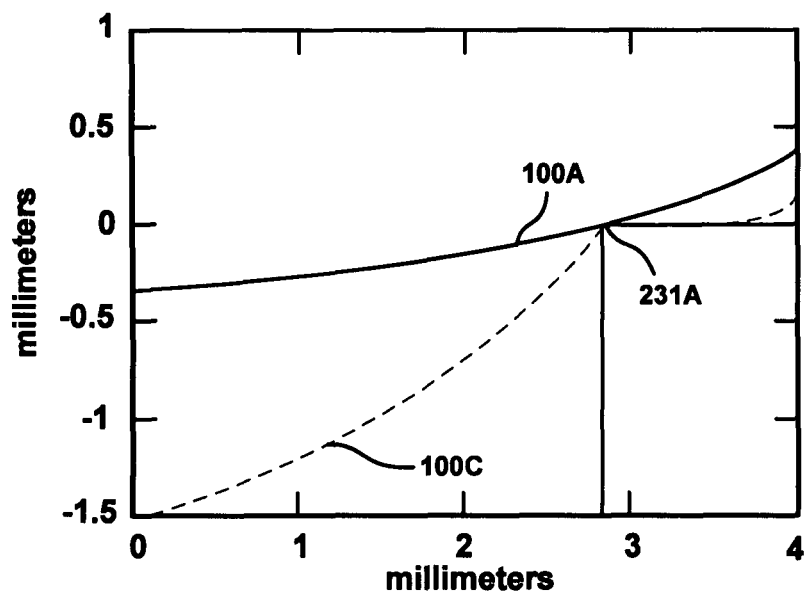

FIG. 5C shows an enlarged example of a large digit 100A, such as a thumb, being deflected into deflected portion 100C by finger deflecting feature 231A. FIG. 5C represents an enlargement of a portion of detail area 595. Approximate dimensions are shown in millimeters and are representative of only one example implementation of an embodiment of the presently described technology.

Figure 5D:
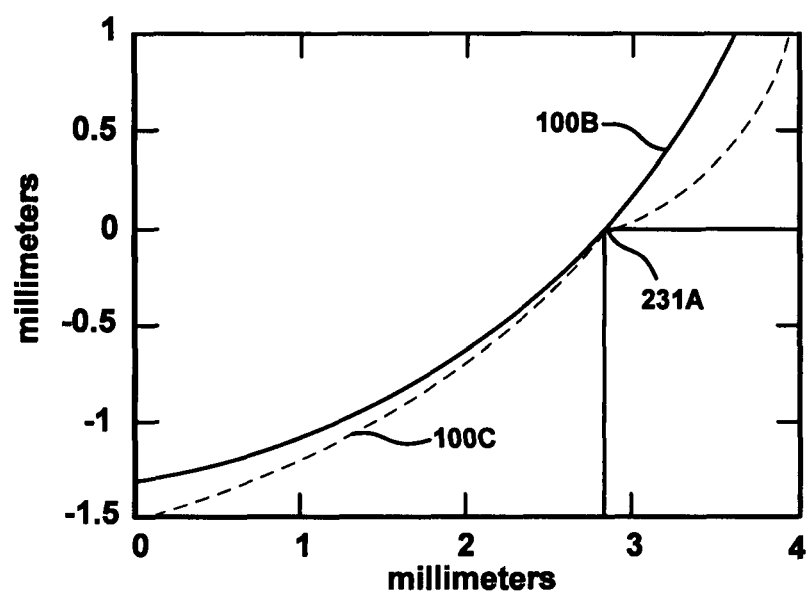

FIG. 5D shows an enlarged example of a small digit 100B, such as a small woman's index finger, being deflected into deflected portion 100C by finger deflecting feature 231A. FIG. 5D represents an enlargement of a portion of detail area 595. FIG. 5D illustrates that required deflection is less for the smaller finger (100B) than for the larger finger (100A) shown in FIG. 5C. Approximate dimensions are shown in millimeters and are representative of only one example implementation of an embodiment of the presently described technology.

Example Implementations

Figure 6:
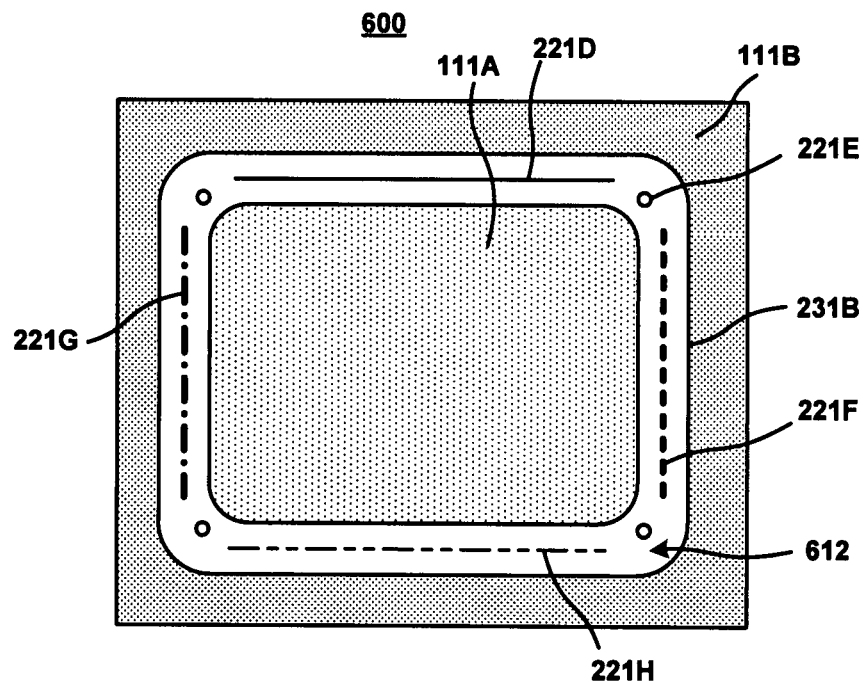
FIG. 6 shows a plan view of a two-dimensional navigation surface in conjunction with scroll bar and button configuration of a capacitive sensing device with a tactile feedback apparatus, according to one embodiment.

FIG. 6 shows a plan view of a two dimensional navigation surface 600 in conjunction with a scroll bar and button configuration of a capacitive sensing device 110E (shown in FIG. 7) with a tactile feedback apparatus, according to one embodiment. As can be seen, a finger receiving recess 612 surrounds a dielectric surface 111A of navigation surface 600. A second portion of dielectric surface 111B surrounds finger receiving recess 612. Finger receiving recess 612 is similar to finger receiving recess 112B (FIG. 2B), except that only one finger deflecting feature, finger deflecting feature 231B, is utilized. Dielectric surfaces 111A and 111B are similar to dielectric surface 111, which has been previously described. Finger receiving recess 612 is defined as a recess between dielectric surfaces 111A and 111B. Tactile feedback elements in the form of raised ridges (221D, 221F, 221G, 221H) and raised point 221E are disposed near a bottom portion of finger receiving recess 612. These tactile feedback elements are consistent with the description of tactile feedback element 212 of FIG. 2A. Raised tactile feedback elements 221D, 221E, 221F, 221G, 221H demonstrate how different shapes of tactile elements may be utilized such that a user may differentiate contact with a particular region (e.g., top, bottom, left, right, or corner) of a navigation surface, such as tactile navigation surface 600. In one embodiment, raised tactile feedback element 221E is associated with a region of tactile navigation surface 600 that is configured as a "button", or as a tap zone for accepting button like inputs from a user in response to taps from a user digit. Finger deflecting feature 231B defines one edge of finger receiving recess 612. FIG. 6 provides one example of a finger deflecting feature, such as 231B, circumscribing a finger receiving recess.

Figure 7:
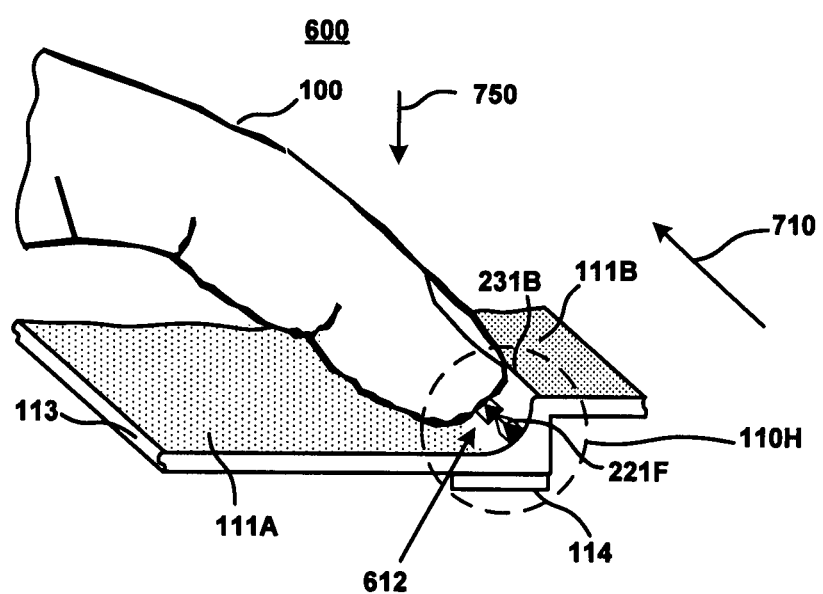
FIG. 7 shows a perspective sectional view of the scroll bar of FIG. 6, in use by a finger, according to an embodiment.

FIG. 7 shows a perspective sectional view of the scroll bar configuration of capacitive sensing device 110E with a tactile feedback apparatus (as shown in FIG. 6), in use by a finger 100, according to an embodiment. Like numbered elements of FIGS. 6 and 7 are the same. Additionally, dielectric material 113 and capacitive sensor electrode 114 are visible. FIG. 7 shows how finger 100 may be inserted substantially in direction 750 into finger receiving recess 612 of capacitive sensing device 110E. Finger deflecting feature 231B causes finger 100 to deflect into a predictable and repeatable shape (such as shape 100C of FIGS. 5A and 5B). Tactile feedback device 221F provides tactile feedback to finger 100 to inform a user that finger 100 has been sufficiently pressed into finger receiving recess 612 to cause actuation of capacitive sensing device 110E through capacitive coupling with capacitive sensor electrode 114. Because capacitive sensing device 110E is configured as a scroll bar, finger 100 may be slidably moved, for example, in direction 710, while in continued or intermittent contact with various tactile feedback elements. This sliding movement of finger 100 will provide an input to an electronic device or computer via capacitive sensing device 110E.

Figure 8:
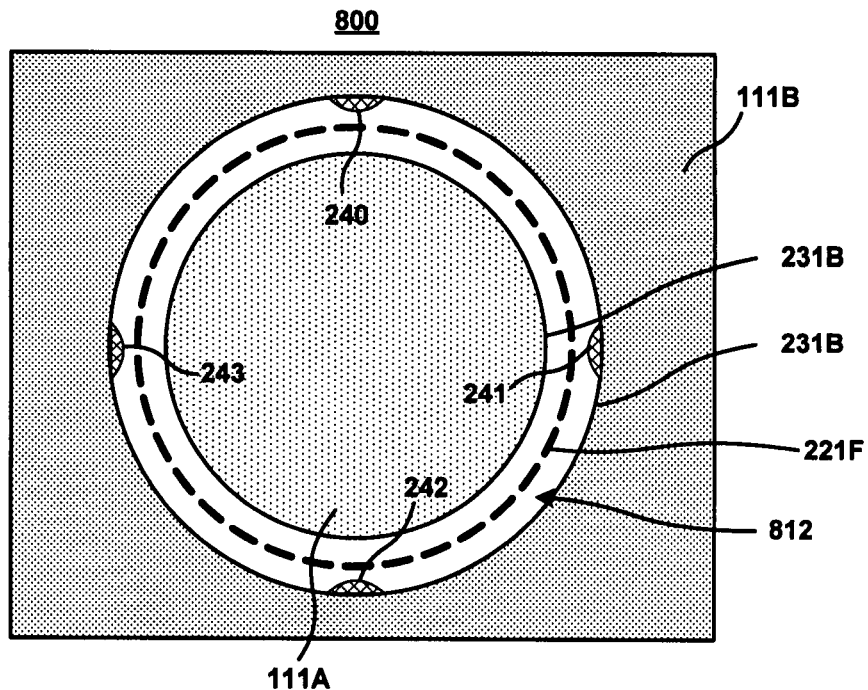
FIG. 8 shows a plan view of a navigation surface in conjunction with a scroll circle configuration of a capacitive sensing device with a tactile feedback apparatus, according to an embodiment.

FIG. 8 shows a plan view of a navigation surface 800 in conjunction with a scroll circle configuration of a capacitive sensing device 110J (shown in FIG. 9) with a tactile feedback apparatus, according to an embodiment. As can be seen, a finger receiving recess 812 surrounds a dielectric surface 111A of navigation surface 800. A second portion of dielectric surface 111B surrounds finger receiving recess 812. Finger receiving recess 812 is similar to finger receiving recess 112B (FIG. 2B), except that two finger deflecting features 231B are utilized. Dielectric surfaces 111A and 111B are similar to dielectric surface 111, which has been previously described. Finger receiving recess 812 is defined as a recess between dielectric surfaces 111A and 111B. Tactile feedback elements in the form of raised ridges 221F are disposed near a bottom portion of finger receiving recess 812. These tactile feedback elements are consistent with the description of tactile feedback element 212 of FIG. 2A. Finger deflecting features 231B define inner and outer edges of finger receiving recess 812. FIG. 8 provides another example of how a finger deflecting feature, such as 231B, may circumscribe a finger receiving recess. Additional locating elements (e.g. 240, 241, 242, 243) may also be used to help a user align or locate their finger relative to the sensing device.

Figure 9:
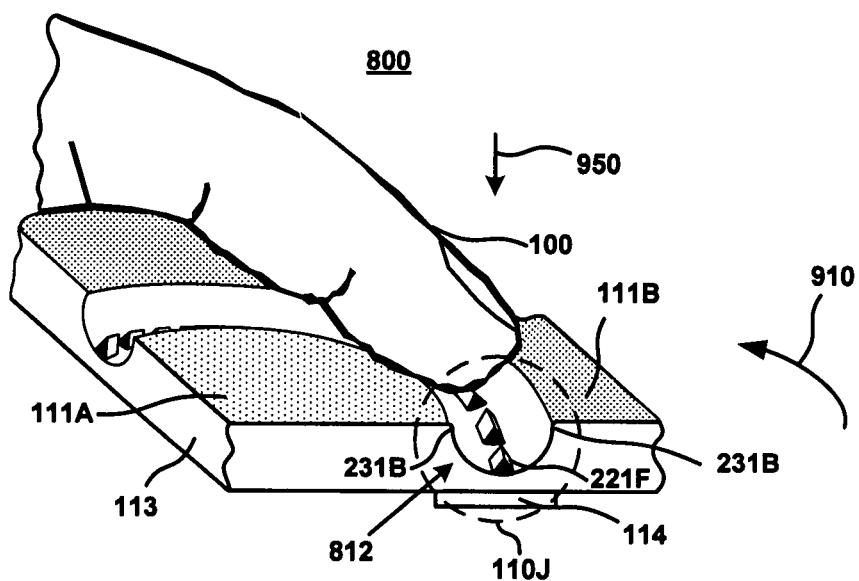
FIG. 9 shows a perspective sectional view of the scroll circle of FIG. 8, in use by a finger, according to an embodiment.

FIG. 9 shows a perspective sectional view of the scroll circle configuration of capacitive sensing device 110J with a tactile feedback apparatus (as shown in FIG. 8), in use by a finger 100, according to an embodiment. Like numbered elements of FIGS. 8 and 9 are the same. Additionally, dielectric material 113 and capacitive sensor electrode 114 are visible. FIG. 9 shows how finger 100 may be inserted substantially in direction 950 into finger receiving recess 812 of capacitive sensing device 110J. Finger deflecting features 231B cause finger 100 to deflect into a predictable and repeatable shape (such as shape 100C of FIGS. 5A and 5B). Tactile feedback device 221F provides tactile feedback to finger 100 to inform a user that finger 100 has been sufficiently pressed into finger receiving recess 812 to cause actuation of capacitive sensing device 110J through capacitive coupling with capacitive sensor electrode 114. Because capacitive sensing device 110J is configured as a scroll circle, finger 100 may be slidably moved, for example, in direction 910, while in continued or intermittent contact with various tactile feedback elements. This sliding movement of finger 100 will provide an input to an electronic device or computer via capacitive sensing device 110J. It is appreciated that a sensing device, such as sensing device 110J, may include other sensing electrodes in addition to capacitive sensor electrode 114 shown.

Figure 10A:
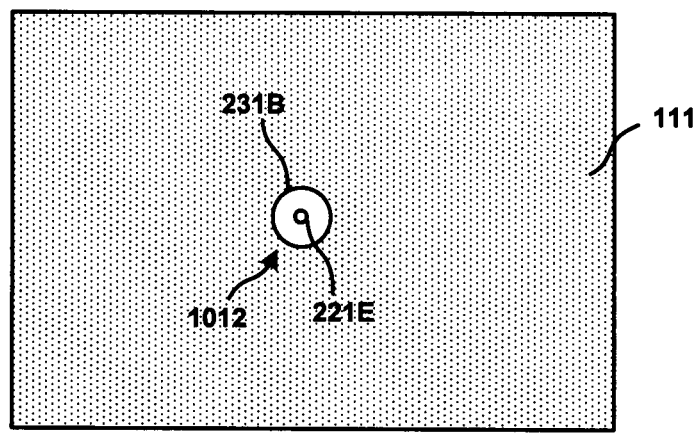
FIGS. 10A and 10B show plan views of example button configurations of a capacitive sensing device with a tactile feedback apparatus, according to an embodiment.

FIG. 10A shows a plan view of a button configuration 1000A of a capacitive sensing device 110K (shown in FIG. 11) with a tactile feedback apparatus, according to an embodiment. As can be seen, a finger receiving recess 1012 is defined in a dielectric surface 111. Finger receiving recess 1012 is similar to finger receiving recess 112B (FIG. 2B), except that only one deflecting feature, finger deflecting feature 231B, is utilized. A tactile feedback element in the form of a raised point 221E is disposed near a bottom portion of finger receiving recess 1012. This tactile feedback element is consistent with the description of tactile feedback element 212 of FIG. 2A. Finger deflecting feature 231B defines a single edge circumscribing finger receiving recess 1012.

Figure 10B:
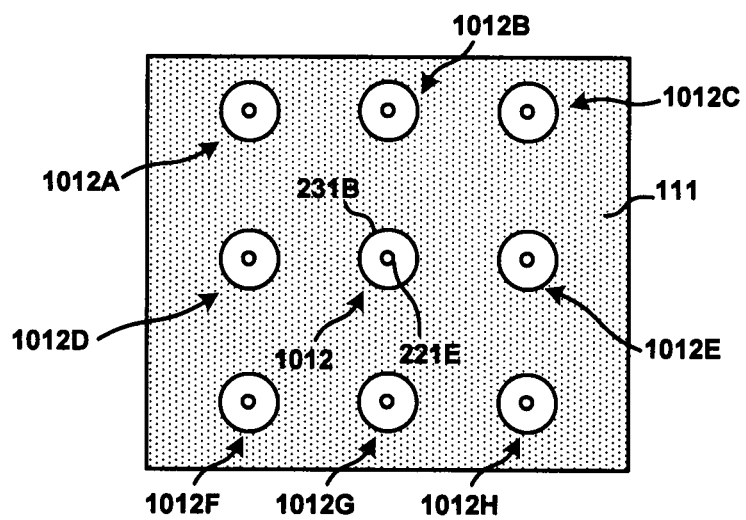

FIG. 10B shows a plan view of a button configuration 1000B of a capacitive sensing device 110K (shown in FIG. 11) with a tactile feedback apparatus, according to an embodiment. As can be seen, FIG. 10B shows a button configuration 100B, with a plurality of buttons (1012, 1012A, 1012B, 1012C, 1012D, 1012E, 1012F, 1012G, 1012H) in the form of a button keypad/keymat. It is appreciated that configuration 1000B is shown by way of example and not of limitation and that other configurations of more or less buttons similar to button 1012 (or of different shapes and/or form factors) are possible and anticipated. Hence, a benefit derived by virtue of the present technology is that when utilizing a plurality of capacitive sensing devices with tactile feedback a user is able to determine not only whether he has touched a button of choice, but also whether he has touched a different button. This allows "buttons" to be more closely spaced with comparable usability.

Figure 11:
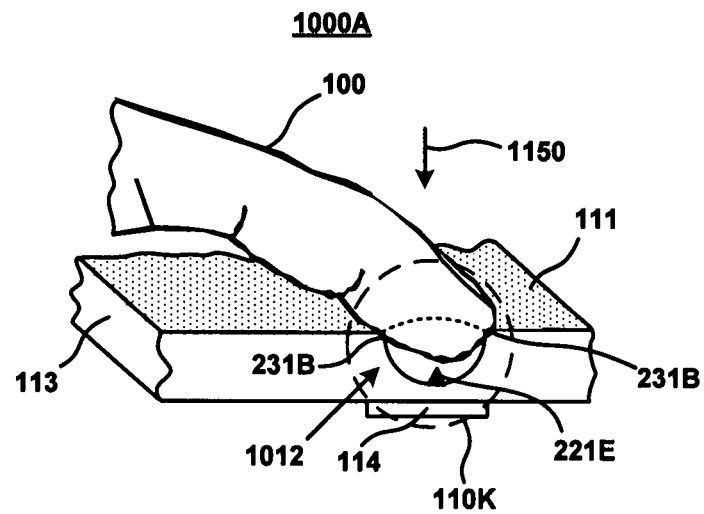
FIG. 11 shows a perspective sectional view of the button configuration of FIG. 10A, in use by a finger, according to an embodiment.

FIG. 11 shows a perspective sectional view of the button configuration 1000A of FIG. 10A, in use by a finger 100, according to an embodiment. Like numbered elements of FIGS. 10A and 11 are the same. Additionally, dielectric material 113 and capacitive sensor electrode 114 are visible. FIG. 11 shows how finger 100 may be inserted substantially in direction 1150 into finger receiving recess 1012 of capacitive sensing device 110K. Finger deflecting feature 231B causes finger 100 to deflect into a predictable and repeatable shape (such as shape 100C of FIGS. 5A and 5B). Tactile feedback device 221E provides tactile feedback to finger 100 to inform a user that finger 100 has been sufficiently pressed into finger receiving recess 1012 to cause actuation of capacitive sensing device 110K through capacitive coupling with capacitive sensor electrode 114. Because capacitive sensing device 110K is configured as a button, finger 100 may be removed after touching tactile feedback element 221F, if only a single button actuation is required.

Embodiments described herein have several advantages such as reducing issues with both false (accidental) activations and the user perception of incorrectly rejected actuation attempts by providing more consistent thresholds and immediate tactile feedback. Embodiments described herein provide these advantages to capacitive sensing devices with a minimum impact on cost, mechanical complexity, and design constraint of the capacitive sensing devices. Additionally, these advantages are provided without requiring the use of moving parts. By providing a user with a tactile control loop, as described herein, speed, accuracy, satisfaction, and reliability of a variety of capacitive sensing devices is improved. Additional elements providing further visual, auditory, or tactile feedback may also be used.

The foregoing descriptions of specific embodiments have been presented for purposes of illustration and description. They are not intended to be exhaustive or to limit the presented technology to the precise forms disclosed, and obviously many modifications and variations are possible in light of the above teaching. The embodiments were chosen and described in order to best explain the principles of the presented technology and its practical application, to thereby enable others skilled in the art to best utilize the presented technology and various embodiments with various modifications as are suited to the particular use contemplated. It is intended that the scope of the present technology be defined by the claims appended hereto and their equivalents.

What is claimed is:

1. A tactile feedback apparatus for a capacitive sensing device, said tactile feedback apparatus comprising:
   a dielectric insulator having a surface; and
   a finger receiving recess defined in said surface, said finger receiving recess configured for receiving a deflected portion of a finger, wherein a maximum interior cross-sectional measurement of said finger receiving recess is less than ten millimeters, said finger receiving recess comprising:
      a finger deflecting feature coupled to said surface and structured such that a variety of finger sizes pressed into said finger receiving recess would deflect into a predictable and repeatable shape for affecting the capacitive sensing device in a substantially uniform manner; and
      a tactile feedback element coupled to said surface and disposed such that said tactile feedback element contacts said deflected portion of said finger to provide tactile feedback to said finger only when said finger is sufficiently deflected into said finger receiving recess to actuate said capacitive sensing device.

2. The apparatus of claim 1, wherein said finger receiving recess further comprises a contoured interior contact surface configured for receiving contact from said deflected portion of said finger.

3. The apparatus of claim 2, wherein said contoured interior contact surface further comprises a floating top surface conductor.

4. The apparatus of claim 1, wherein a portion of said finger receiving recess is filled with a conformal dielectric material, such that said finger deflects said conformal dielectric material if said finger contacts said tactile feedback element.

5. The apparatus of claim 1, wherein said finger deflecting feature comprises a raised protrusion disposed along at least a portion of an opening defined in said surface by said finger receiving recess.

6. The apparatus of claim 1, wherein said finger deflecting feature circumscribes said finger receiving recess.

7. The apparatus of claim 1, wherein said tactile feedback element comprises a protrusion disposed within said finger receiving recess.

8. The apparatus of claim 7, wherein said tactile feedback element has a radius of curvature of no more than five millimeters.

9. The apparatus of claim 1, wherein said predictable and repeatable finger shape is shaped substantially like a portion of a sphere.

10. The apparatus of claim 1, wherein said predictable and repeatable finger shape is shaped substantially like a portion of a cylinder.

11. A capacitance sensing device, said device comprising:
   a dielectric insulator having a surface;
   a finger receiving recess defined in said surface, said finger receiving recess configured for receiving a deflected portion of a finger, said finger receiving recess comprising:
      a finger deflecting feature coupled to said surface and structured such that a variety of finger sizes pressed into said finger receiving recess would deflect into a predictable and repeatable shape for affecting the capacitive sensing device in a substantially uniform manner; and
      a tactile feedback element coupled to said surface and disposed such that said tactile feedback element contacts said deflected portion of said finger to provide tactile feedback to said finger when said finger is sufficiently deflected into said finger receiving recess to actuate said capacitive sensing device; and
   a capacitive sensor electrode coupled to said dielectric insulator, said capacitive sensor electrode configured for sensing said deflected portion of said finger, wherein said capacitive sensor electrode is configured to be actuated by said finger if said finger deflects into said finger receiving recess beyond a threshold amount, the threshold amount between that of an undeflected contact of said finger with said finger deflecting feature and that of a deflected contact of said finger with said tactile feedback element.

12. The device of claim 11, wherein said finger deflecting feature comprises a raised protrusion disposed along at least a portion of an opening defined in said surface by said finger receiving recess.

13. The device of claim 11, wherein said finger deflecting feature circumscribes said finger receiving recess.

14. The device of claim 11, wherein said tactile feedback element comprises a protrusion disposed near a bottom portion of said finger receiving recess.

15. The device of claim 11, wherein said finger receiving recess further comprises a floating top surface conductor.

16. A tactile feedback apparatus for a capacitive sensing device, said tactile feedback apparatus comprising:
   a dielectric insulator having a surface; and
   a finger receiving means defined in said surface, said finger receiving means configured for receiving a deflected portion of a finger, wherein a maximum interior cross-sectional measurement of said finger receiving means is less than ten millimeters, said finger receiving means comprising:
      a finger deflecting means coupled to said surface and structured such that a variety of finger sizes pressed into said finger receiving means would deflect into a predictable and repeatable shape for affecting the capacitive sensing device in a substantially uniform manner; and a tactile feedback means coupled to said surface and disposed such that said tactile feedback means contacts said deflected portion of said finger to provide tactile feedback to said finger only when said finger is sufficiently deflected into said finger receiving means to actuate said capacitive sensing device.

17. The apparatus of claim 16, wherein said finger receiving means further comprises a contoured interior contact surface configured for receiving contact from said deflected portion of said finger.

18. The apparatus of claim 17, wherein said contoured interior contact surface further comprises a floating top surface conductor.

19. The apparatus of claim 16, wherein a portion of said finger receiving means is filled with a conformal dielectric material, such that said finger deflects said conformal dielectric material if said finger contacts said tactile feedback means.

20. The apparatus of claim 16, wherein said finger deflecting means circumscribes said finger receiving means.

21. The apparatus of claim 16, wherein said tactile feedback means is disposed within said finger receiving means.

22. The apparatus of claim 16, wherein said predictable and repeatable finger shape is shaped substantially like a portion of a sphere.

23. The apparatus of claim 16, wherein said predictable and repeatable finger shape is shaped substantially like a portion of a cylinder.

24. The apparatus of claim 16, wherein said finger deflecting means is disposed within said finger receiving means.

* * * * *